United States Patent [19]
Hsieh et al.

[11] Patent Number: 5,734,334
[45] Date of Patent: Mar. 31, 1998

[54] PROGRAMMABLE PORT FOR CROSSBAR SWITCH

[75] Inventors: Wen-Jai Hsieh; Chi-Song Horng; Chun Chiu Daniel Wong, all of Palo Alto; Gerchih Chou, San Jose; Shrikant Sathe, Saratoga; Kent Dahlgren, San Jose, all of Calif.

[73] Assignee: I-Cube, Inc., Campbell, Calif.

[21] Appl. No.: 516,320

[22] Filed: Aug. 17, 1995

Related U.S. Application Data

[63] Continuation-in-part of Ser. No. 333,484, Nov. 2, 1994, Pat. No. 5,625,780, which is a continuation-in-part of Ser. No. 171,752, Dec. 21, 1993, Pat. No. 5,426,738, which is a continuation of Ser. No. 785,082, Oct. 30, 1991, abandoned.

[51] Int. Cl.$^6$ .................................................. H04Q 1/00
[52] U.S. Cl. .............. 340/827; 340/825.79; 340/825.83; 395/311; 395/312; 326/82; 326/38; 326/41; 326/86
[58] Field of Search .................... 340/826, 827, 340/825.79, 825.83; 395/275, 309, 311, 312; 326/86, 82, 38, 41, 39

[56] References Cited

U.S. PATENT DOCUMENTS

| | | | |
|---|---|---|---|
| 5,182,554 | 1/1993 | Kaiser et al. | 340/826 |
| 5,202,593 | 4/1993 | Huang et al. | 326/86 |
| 5,282,271 | 1/1994 | Hsieh et al. | . |
| 5,426,738 | 6/1995 | Hsieh et al. | 326/38 |
| 5,428,750 | 6/1995 | Hsieh et al. | . |
| 5,428,800 | 6/1995 | Hsieh et al. | . |
| 5,465,056 | 11/1995 | Hsieh et al. | 326/41 |
| 5,530,814 | 6/1996 | Wong et al. | 395/312 |
| 5,555,971 | 9/1996 | Hsieh et al. | 395/312 |
| 5,625,780 | 4/1997 | Hsieh et al. | 395/311 |

*Primary Examiner*—Edwin C. Holloway, III
*Attorney, Agent, or Firm*—Smith-Hill and Bedell

[57] ABSTRACT

An electronic crossbar switch employs a switch array for selectively routing digital and analog signals between its terminals. A separate port for each terminal provides a path for digital and analog signals flowing in and out of the switch. Each port can be configured to operate with or without tristate buffering under control of a tristate control signal, to optionally latch input or output signals in response to clock and clock enable signals, and to buffer signals passing in or out of the switch terminal with or without an input direction control signal. A set of control inputs are provided in common to all ports, allowing an external host to transmit control signals in parallel to each port. Each port may be programmed to select any of its control inputs as its tristate, clock enable, clocking or direction control signal.

12 Claims, 4 Drawing Sheets

PROGRAMMABLE PORT FOR CROSSBAR SWITCH

CROSS-REFERENCE TO RELATED APPLICATIONS

The present application is continuation-in-part of U.S. Pat. No. 5,625,780 issued Apr. 29, 1997 on U.S. application Ser. No. 08/333,484 filed Nov. 2, 1994 as a continuation-in-part of U.S. Pat. No. 5,426,738 issued Jun. 20, 1995 on application Ser. No. 08/171,752 filed Dec. 21, 1993 as a continuation of U.S. patent application Ser. No. 07/785,082 filed Oct. 30, 1991, now abandoned.

BACKGROUND OF THE INVENTION

1. Field of the Invention

The present invention relates in general to crossbar switches and in particular to a port for a crossbar switch that may be programmed to provide alternative buffering modes.

2. Description of Related Art

A typical electronic crossbar switch includes a set of ports, a switch array interconnecting the ports, and a static random access memory (SRAM). The switch array is made up of pass transistors, each controlled by a separate bit stored in the SRAM and each selectively interconnecting a separate pair of the ports. The crossbar switch can route a signal between any two ports by turning on the appropriate pass transistor so that it provides a signal path between the two ports. In a nonblocking crossbar switch a connection between any two ports can always be established regardless of the state of other connections in the switch array and a connection between any two ports can be broken without affecting any other connection. A crossbar switch can be used for bus switching, data path routing and packet switching networks.

It is often desirable or necessary to provide ports which buffer signals as they pass in or out of the crossbar switch. The buffering operation provided by a port can include amplification, level shifting or inversion, latching or other signal conditioning processes. U.S. Pat. No. 5,282,271 titled I/O BUFFERING SYSTEM TO A PROGRAMMABLE SWITCHING APPARATUS issued Jan. 25, 1994 to Wen-Jai Hsieh et al describes a crossbar switch having a buffer in each switch port. Each port includes internal registers for storing control data supplied to the port via a serial bus for controlling various modes of buffer operation. Each port may operate in either bidirectional and unidirectional buffering modes. In the bidirectional mode, the port automatically senses the direction of signal flow into the port and buffers the signal in the appropriate direction.

When the port is operating as a unidirectional, tristate input or output buffer, tristate control is provided by a set of 8 tristate control lines TS0–TS7 supplied in common to all buffers. Each buffer includes an internal multiplexer for selecting one of the 8 tristate control lines for controlling the buffer's tristate operation and an internal register storing programming data for controlling the multiplexer selection. Note that since there are only eight tristate control lines, tristate operation of only a maximum of eight switch ports can be independently controlled. One could increase the number of input tristate control lines, but this would also increase the number of pins of the integrated circuit implementing the crossbar switch, thereby increasing the size and cost of the integrated circuit package.

Since the port disclosed in the aforementioned patent automatically senses the direction of the digital data signals passing in or out of the switch, it does not require an externally generated directional control signal. However in some applications it is necessary to allow an external device to control the direction of port buffering. But providing independent direction control signal inputs to each port would vastly increase the number of control signal inputs to the ports and therefore increase the size and cost of the device package.

In some applications, it would also be desirable for each port to operate in a synchronous fashion, latching incoming and outgoing signals in response to input clock and clock enable signals. However, the necessary clock and clock enable inputs to each port would also greatly increase the number of control signal inputs required, particularly for large crossbar switches having many ports.

In other applications it may also be desirable to use the crossbar switch to route analog as well as digital signals. However the buffers in the prior art patent handle only digital data signals and prevent the use of the crossbar switch for routing analog signals.

What is needed is a crossbar switch having a port at each terminal which may configured to buffer either analog or digital data signals with control of tristate buffering, latching and buffering direction provided by externally generated control signals requiring only a relatively small number of control signal inputs.

SUMMARY OF THE INVENTION

In accordance with one aspect of the invention, an electronic crossbar switch employs a switch array for selectively routing analog and digital data signals between its ports. Each port can be programmably configured to provide a separate signal path for either analog or digital data signals passing in or out of the switch array. When providing an input/output path for a digital data signal, each buffer can be configured for either unidirectional or bidirectional signal transmission, with or without tristate buffering and with or without clocked latching of the digital data signal. The port may operate under control of externally generated control signals including tristate buffer or direction control signals and latch clock and clock enable signals.

In accordance with another aspect of the invention, a set of control inputs are provided in common to all ports, allowing an external host controller to transmit control signals to each port. Each port may be programmed to select any of its control inputs for use as a tristate, clock enable, clock or direction control signal. The ability of the ports to select the function of each particular control input gives the port flexibility in the use of control inputs and reduces the number of crossbar switch control inputs required to implement various modes of port operation.

It is accordingly an object of the invention to provide a crossbar switch for routing analog and digital data signals between its terminals with programmable buffering and directional control modes. It is another object of the invention to minimize the number of externally generated control signal inputs needed to control the ports.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

DESCRIPTION OF THE PREFERRED EMBODIMENT(S)

Figure 1:
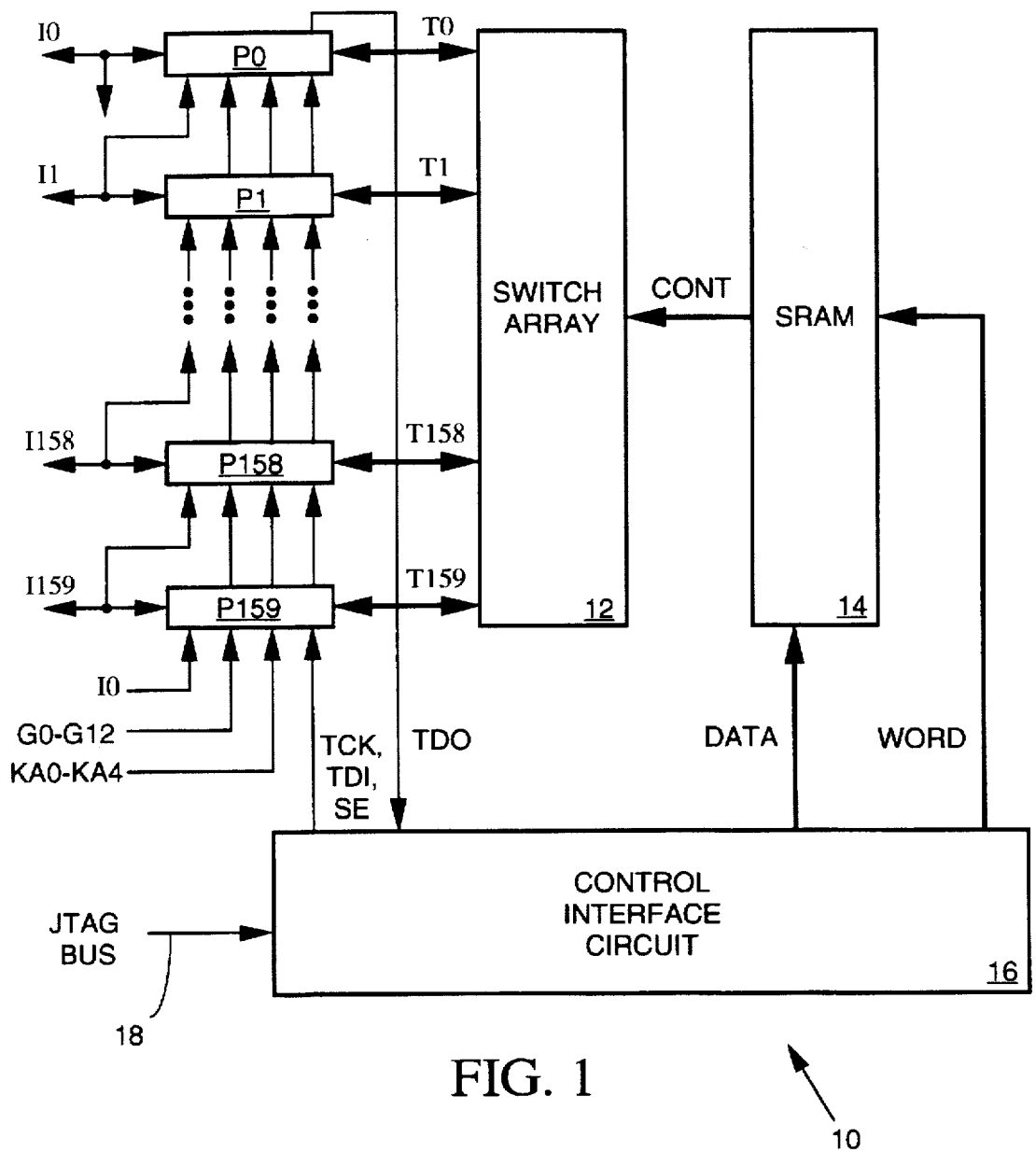
FIG. 1 illustrates in block diagram form a crossbar switch in accordance with the present invention.

FIG. 1 illustrates in block diagram form a programmable crossbar switch 10 in accordance with the present invention. Crossbar switch 10 includes a set of 160 programmable ports P0–P159, a switch array 12, a static random access memory 14, and a control interface circuit 16. Each port P0–P159 provides a buffered digital data signal path or an unbuffered analog signal path between an I/O terminal I0–I159 and a corresponding terminal T0–T159 of switch array 12. A set of 13 general purpose control signal inputs G0–G12 and a 5 line "key" bus KA0–KA4 are supplied in common to each port P0–P159. The control signal inputs G0–G12 and key bus KA0–KA4 permit an external controller to control various functions of the ports in a manner described herein below.

Switch array 12 selectively routes digital or analog data signals between pairs of its terminals T0–T159 in accordance with routing control signals CONT provided by SRAM 14. An external host controller transmits routing control data to control interface circuit 16 via an IEEE standard JTAG bus 18. Control interface circuit 16 writes the routing control data into SRAM 14 and that data sets the states of the routing control signals CONT. Ports P0–P159 may be programmed to operate in various modes. The host controller also transmits data for selecting the various analog or digital operating modes of ports P0–P159. The control interface circuit 16 forwards the mode control data in serial fashion to ports P0–P159 via a data line TDI using an enable signal SE to input enable registers within the ports and a TCK clock signal to clock the data into the registers.

Crossbar switch 10 may, for example, be programmed such that an input digital data signal arriving at terminal I0 departs at terminal I158. Port P0 buffers the digital data signal arriving at terminal I0 onto terminal T0. Switch array 12 routes the digital data signal from terminal T0 to terminal T158 in accordance with the routing control signals CONT supplied by SRAM 14. Port P158 then buffers the digital data signal at terminal T158 onto terminal I158. Crossbar switch 10 may also be programmed to route analog signals. Port P0 passes (without buffering) an analog signal arriving at, for example, terminal I0 to terminal T0. Switch array 12 then routes the analog signal via, for example, terminal T158 to port P158. Port 158 then passes the analog signal without buffering to terminal I158.

The switch array 12 is a triangular 160×160 array of pass transistors. The gate of each pass transistor is controlled by a separate one of routing control signals CONT and each pass transistor selectively interconnects a unique pair of terminals T0–T159. Array 12 can route digital or analog signals between any two terminals T0–T159 by turning on the appropriate pass transistor so that it provides a signal path between the two terminals. Switch 12 is "nonblocking" in that only one pass transistor needs to be turned on in order to make a connection between any two ports and a connection between any two terminals can always be established regardless of the state of other connections provided by the switch. In other words, the switch array 12 can make or break a connection between any two of terminals T0–T159 without affecting any other connection. Triangular switch arrays are well known to those skilled in the art. A suitable switch array is described in U.S. Pat. No. 5,282,271 titled I/O BUFFERING SYSTEM TO A PROGRAMMABLE SWITCHING APPARATUS issued Jan. 25, 1994 to Wen-Jai Hsieh et al., incorporated herein by reference.

SRAM 14 is a static random access memory for storing 160 data words, each data word having up to 160 bits. SRAM 14 includes a 160 bit parallel data input (DATA) and 160 word select inputs (WORD). SRAM replaces one of its data words with a word appearing on DATA whenever one of the WORD lines is asserted. The particular WORD line being asserted indicates the stored word to be replaced. To write data into SRAM 14, an external host controller sends a set of 160-bit data words to controller 16 via the serial JTAG bus 18. The host controller also sends an address with each data word indicating a location within SRAM 14 at which the data word is to be stored. Controller 16 places each word on the DATA lines to SRAM 14 and strobes one of the 160 WORD lines as indicated by the address accompanying the data from the host controller. SRAM 14 stores one bit for each pass transistor in array 12 and each routing control signal CONT output of SRAM 14 indicates the state of a separate bit stored in SRAM 14. Thus each bit in SRAM 14 controls the switching state of a corresponding pass transistor switch in array 12.

Figure 2:
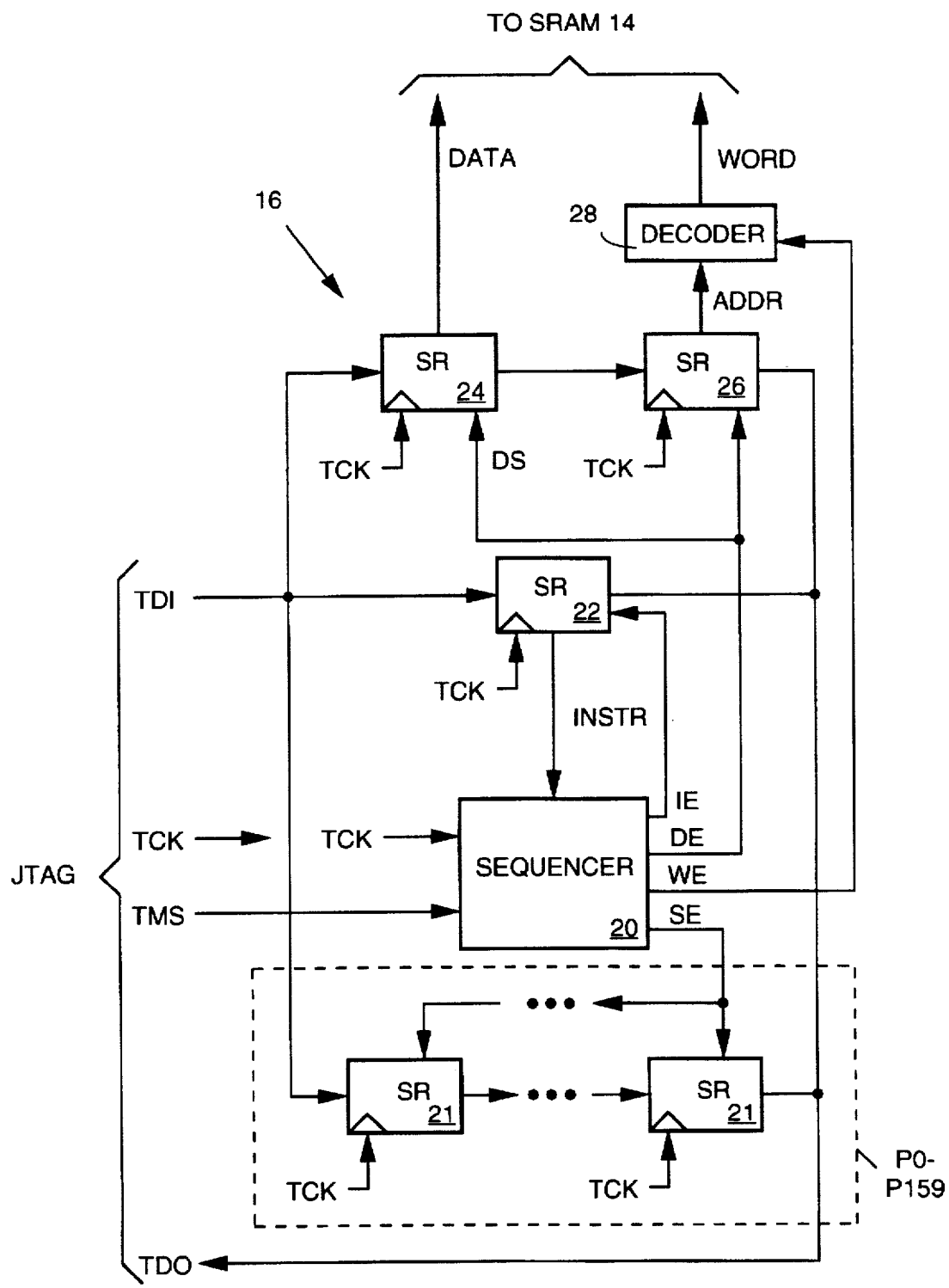
FIG. 2 illustrates the control interface circuit of FIG. 1 in more detailed block diagram form.

FIG. 2 illustrates control interface circuit 16 in more detailed block diagram form. The JTAG bus consists of four lines TDI, TCK, TMS and TDO. The TDI and TDO lines carry data in serial form into and out of circuit 16. TCK is a clock signal controlled by the host controller. The TMS line is a control signal pulsed by the host controller to indicate the host is about to transmit an instruction code on the TDI line. The TMS line provides an input to a sequencer 20. On receipt of a TMS signal pulse from the host controller, sequencer 20 asserts a control signal IE to input enable a shift register 22. Thereafter, on each pulse of the TCK clock signal from the host controller, shift register 22 shifts in a bit of an instruction sent by the host controller via the TDI line. Sequencer 20 counts pulses of the TCK signal and when it determines that all bits of the instruction (suitably 1 bit) have been stored in shift register 22, sequencer 20 turns off the IE enable signal and carries out one of two actions as indicated by the INST instruction INST provided as input to sequencer 20.

The INST instruction may indicate that the host controller is about to send data for programming ports P0–P159 each of which includes a separate serial in/parallel out shift register 21. Shift registers 21 are all connected in series between the TDI and TDO lines of the JTAG bus and data stored in the shift register 21 of each port controls the operating mode of the port. In response to such instruction sequencer 20 asserts the SE signal to input enable the shift register 21 within each port. Thereafter, on each pulse of the TCK signal from the host controller, the shift register 21 in each port P0–P159 shifts in a bit of the control data sent by the host controller via the TDI line. Sequencer 20 counts pulses of the TCK signal and when it determines that all bits of the control data have been stored in the port shift registers, sequencer 20 turns off the SE enable signal. Each shift registers 21 in the 160 ports P0–P159 stores 33 control bits, so the host controller transmits a bit stream consisting of 160×33 control bits to program all of the ports.

The instruction stored in shift register 22 may otherwise indicate that the host controller is about to send a 160-bit data word (DATA) to be written into SRAM 14 of FIG. 1 along with an 8-bit address ADDR selecting one of 160 storage locations within SRAM 14 where DATA is to be written. In response to this instruction sequencer 20 asserts the DE signal to input enable shift registers 24 and 26 which are also connected in series between the TDI and TD0 lines of the JTAG bus. Thereafter, on each pulse of the TCK signal from the host controller, shift registers 24 and 26 shift in a bit of a bit stream containing the data and address sent by the host controller via the TDI line. Shift register 24 receives the DATA word and shift register 26 receives the ADDR bits. Sequencer 20 counts pulses of the TCK signal and when it determines that all data and address bits have been stored in shift registers 24 and 26, sequencer 20 turns off the DE enable signal and pulses a write enable signal WE. Shift register 24 forwards the 160-bit DATA word to the SRAM data input. When sequencer 20 asserts the WE signal, a decoder 28 decodes the 8-bit address ADDR stored in shift register 26 and asserts an appropriate one of 160 write enable inputs (WORD) of the SRAM. This tells the SRAM to store the DATA at the indicated memory address. This memory write process is repeated for each of the 160 storage locations in the SRAM in order to fully program the switch array.

Figure 3:
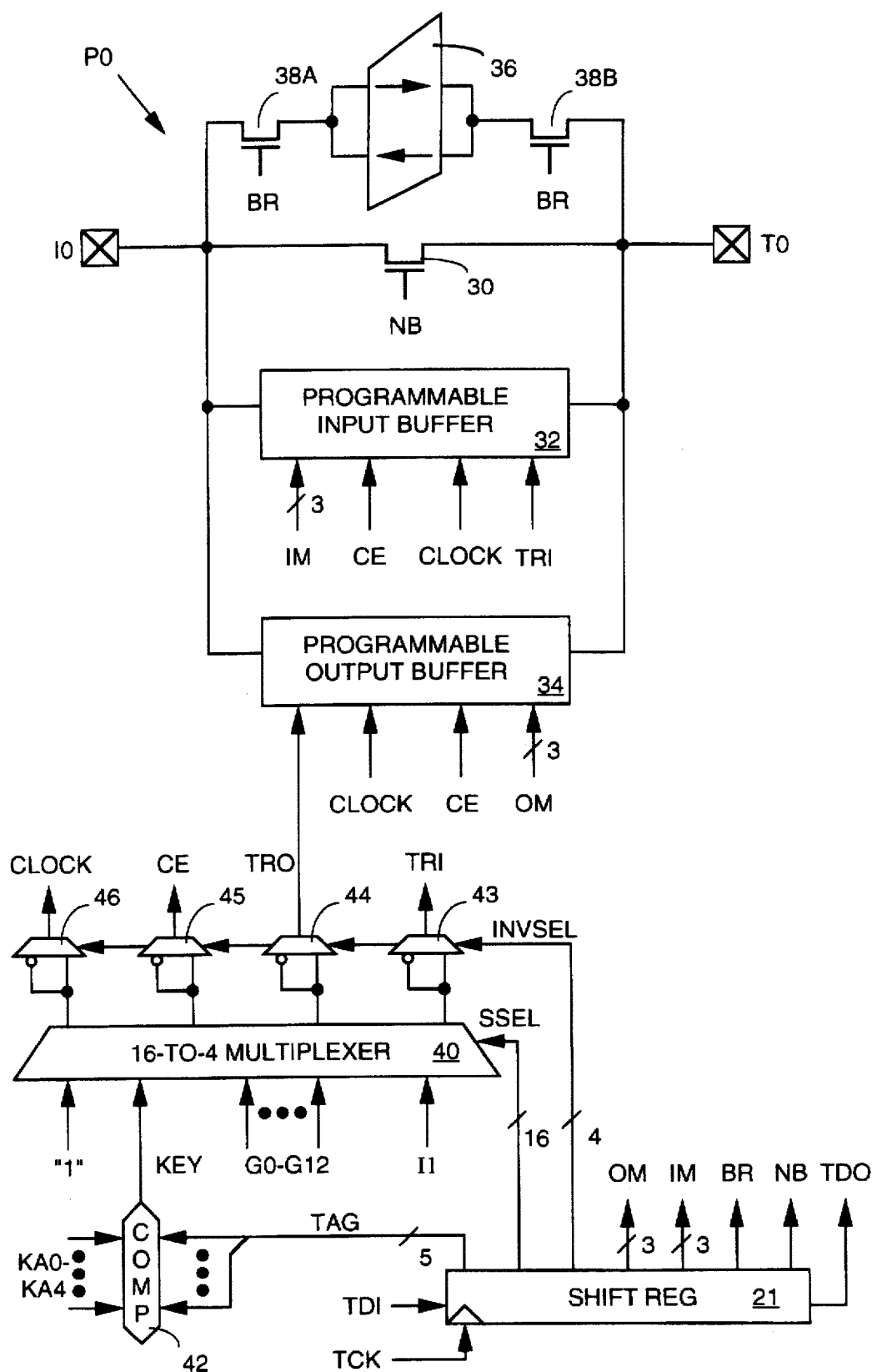
FIG. 3 illustrates port P0 of FIG. 1 in more detailed block diagram form.

FIG. 3 illustrates port P0 in more detailed block diagram form. Ports P1–P159 are similar. Port P0 operates under control of programming data sent to the port from the host computer via controller 16 of FIG. 1. The programming data, stored in a serial- in/parallel-out shift register 21, selects the port's operating modes by selecting one of several signal routing paths within the port.

Analog Signal Path

Port P0 provides an unbuffered analog signal path between terminals I0 and T0 via a pass transistor 30. A data bit NB stored in register 21 may be set high to turn on transistor 30 thereby to establish the analog signal path.

Input and Output Digital Signal Paths

Port P0 also provides buffered, unidirectional input and output digital signal paths between terminals I0 and T0 via programmable input and output buffers 32 and 34. Input buffer 32 buffers an input digital data signal arriving at terminal I0 onto terminal T0. Output buffer 34 buffers an output digital data signal arriving at terminal T0 onto terminal I0. Buffers 32 and 34 operate in various modes as selected by 3-line IM and OM control signals controlled by 6 bits stored in shift register 21. When operating in a tristate mode, buffers 32 and 34 provide tristate output signals respectively under control of tristate control signals TRI and TRO. When operating in a latching mode buffers 32 and 34 latch input signals onto their output terminals in response to input clock (CLOCK) and clock enable (CE) signals. The various operating modes of buffers 32 and 34 are described in detail herein below.

Bidirectional Digital Signal Path

A bus repeater 36 connected to terminals I0 and T0 through pass transistors 38A and 38B provides an optional bidirectional digital signal path between the two terminals I0 and T0. A control signal BR controlled by a bit stored in shift register 21 is supplied to gates of pass transistors 38A and 38B and is asserted to select the bidirectional path. When the bidirectional path is selected bus repeater 36 passes digital signals in either direction between terminals I0 and T0, sensing signal direction automatically without need for a generated direction control signal input.

Control Signal Paths

Control signals G0–G12, produced by external control circuits provide 13 inputs to a 16-4 multiplexer 40. A comparator 42 compares a 5-bit port address sent from an external controller via key bus KA0–KA4 to 5 "TAG" bits stored in shift register 21. If the port address matches the TAG address, comparator 42 asserts a KEY signal supplied to an additional input of multiplexer 40. The I1 terminal of FIG. 1, and a hardwired true "1" logic level provide additional inputs to multiplexer 40. Multiplexer 40, controlled by 16 bits of data (SSEL) stored in shift register 21, selects four signals from among its 16 inputs. The four output signals of multiplexer 40 are supplied to inverting and non-inverting inputs of a set of four multiplexers 43–46, each controlled by a separate bit of four-bit data INVSEL stored in shift register 21. Multiplexers 43–46 produce the CLOCK, CE, TRO and TRI control inputs to input and output buffers 32 and 34. The switching state of each multiplexer 43–46 determines whether it inverts its input when producing its CLOCK, CE, TRO or TRI output signal.

Programmable Buffers

Figure 4:
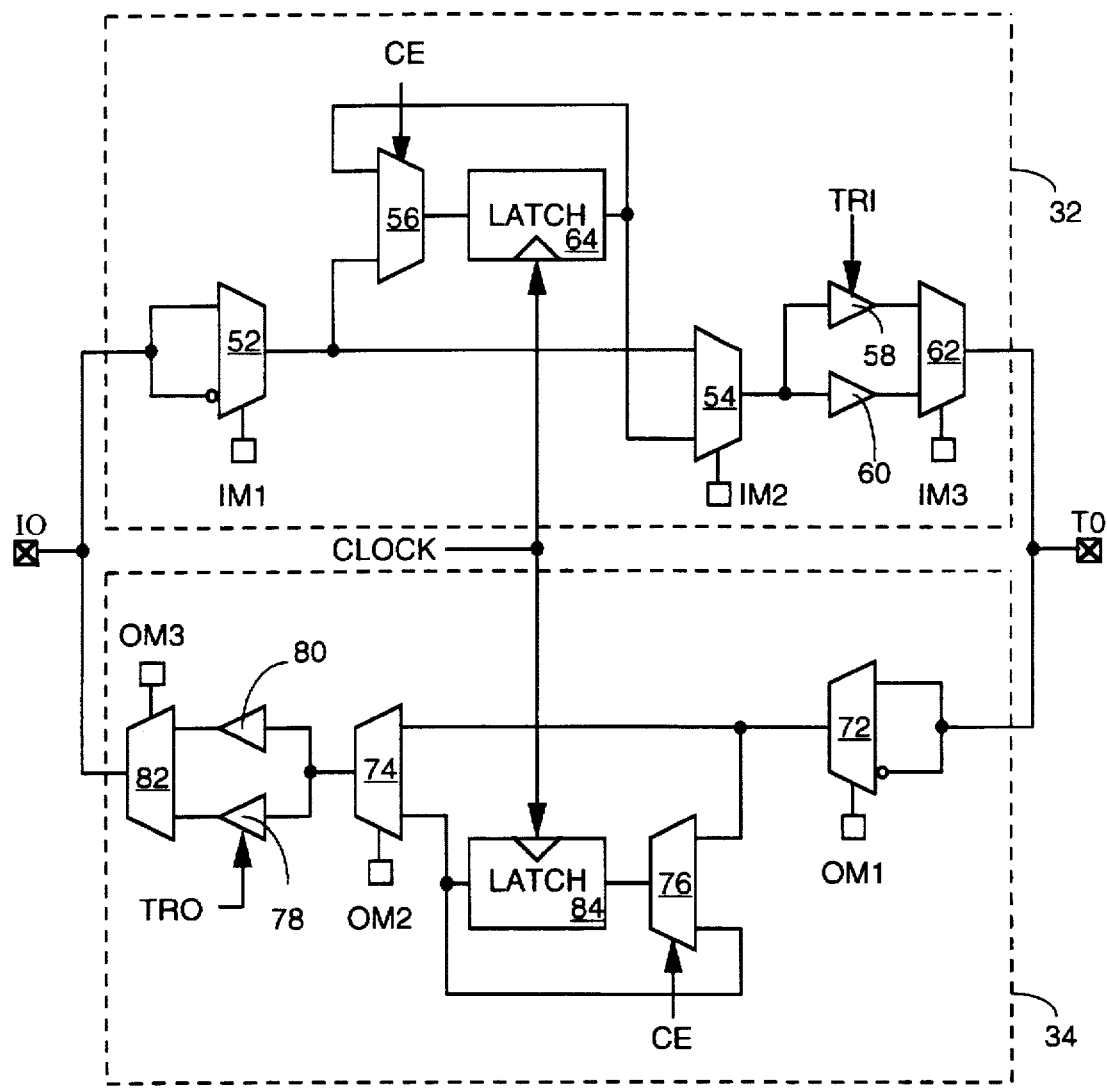
FIG. 4 illustrates the programmable input and output buffers of FIG. 2 in more detailed block diagram form.

FIG. 4 illustrates programmable input and output buffers 32 and 34 in more detailed block diagram form. An externally generated input digital data signal arriving at terminal I0 is delivered to inverting and noninverting inputs of a multiplexer 52 controlled by signal IM1 produced by shift register 21 of FIG. 3. If the port is operating in an "inverting" mode, multiplexer 52 passes its inverting input to its output. When port 0 is operating in a "noninverting" mode multiplexer 52 passes its noninverting input to its output. The output of multiplexer 52 is supplied to inputs of multiplexers 54 and 56. Multiplexer 56, when enabled by a clock enable signal CE, ties the output of multiplexer 52 to a latch 64 which latches its input onto another input of multiplexer 54 in response to a clock signal (CLOCK). When the port is operating in a "latched" mode multiplexer 54, under control of an IM2 signal from register 21 of FIG. 3, ties the output of latch 64 to a pair of buffers 58 and 60. When the port is operating in a "flow-through" mode, multiplexer 54 passes the incoming digital data signal from multiplexer 52 to buffer 58 and 60, which deliver their outputs to two inputs of a multiplexer 62 controlled by an IM3 signal from register 21 of FIG. 3. When the port is configured to operate in a "tristate" operating mode, multiplexer 62 delivers the output of tristate buffer 58 to terminal T0. In a non- tristate mode, multiplexer 62 routes the output of buffer 60 to terminal T0.

A digital data signal arriving at terminal T0 from the switch array is delivered to inverting and noninverting inputs of a multiplexer 72 controlled by an OM1 signal from shift register 21 of FIG. 3. If the port is operating in the inverting mode, multiplexer 72 passes the inverting input to its output. When the port is operating in the noninverting mode multiplexer 72 passes its noninverting input to its output. The output of multiplexer 72 is supplied to inputs of multiplexers 74 and 76. In the flow-through port operating mode multiplexer 74, controlled by an OM2 signal from shift register 21 of FIG. 3, passes the incoming digital data signal from multiplexer 72 to a tristate buffer 78 and a non-tristate buffer 80, which deliver their outputs to two inputs of a multiplexer 82 controlled by an OM3 signal from shift register 21 of FIG. 3. In the tristate mode, multiplexer 82 ties the output of tristate buffer 78 to terminal I0. In the non-tristate mode, multiplexer 82 passes the output of buffer 80 to terminal I0. Multiplexer 76, when enabled by the clock enable signal CE, connects the output of multiplexer 82 to a latch 84 which latches its input onto the input of multiplexer 84. In the latched mode multiplexer 84 delivers the output of latch 84 to buffers 78 and 80.

Port Operating Modes
Input/Output/Bidirectional Modes

Buffers 32 and 34 may be configured to operate in either input, output or bidirectional modes. In the input mode, only input buffer 32 is active. The output buffer 34 is disabled by setting multiplexer 82 to select the output of tristate buffer 78 and setting TRO low to place buffer 78 in tristate mode. TRO may be set low by switching multiplexer 40 of FIG. 3 to select its "1" input as the TRO output and switching multiplexer 44 of FIG. 3 to select its inverting input.

In the output mode, output buffer 34 is active. The input digital data signal path is disabled by setting multiplexer 62 to select the output of tristate buffer 58 and setting TRI low to place buffer 58 in tristate mode. TRI may be set low by switching multiplexer 40 of FIG. 3 to select its "1" input as its TRI output and switching multiplexer 43 of FIG. 3 to select its inverting input.

In the bidirectional mode, the input and output buffers 32 and 34 are alternatively active with the active path being chosen by a selected, externally generated, direction control signal. To configure the port to operate in the bidirectional mode, multiplexers 62 and 82 are switched to select outputs of tristate buffers 58 and 78, respectively. Multiplexer 40 of FIG. 3 is set to select the same control signal input, either one of signals G0–G12, the I1 signal, or the KEY signal, to act as the direction control signal from which both TRO and TRI signals are derived. One of multiplexers 43 and 44 of FIG. 3 is set to select its inverting input while the other is set to select its noninverting input. For example we can set multiplexer 40 to select G0 to drive both TRO and TRI and set multiplexers 43 and 44 to select their inverting and non-inverting inputs, respectively. Thus whenever an external controller asserts the G0 line, the input buffer 32 will be active and whenever the external controller deasserts the G0 line, the output buffer 34 will be active. Thus the G0 signal acts as a direction control signal.

Latched/Flowthrough Modes

Input and output buffers 32 and 34 may be configured for either latched or flow-through modes. When operating in the latched mode, latch 64 latches digital data signals flowing in the input path and latch 84 latches digital data signals flowing in the output path. In the flow-through mode, digital data signals flowing in the input and output paths bypass the latches.

To configure the input buffer 32 for the latched mode, multiplexer 54 is switched to select the output of latch 64. Multiplexer 40 of FIG. 3 is set to select a desired control input for the clock enable signal CE and multiplexer 45 is set depending on whether the control input is to be inverted. When the clock enable signal CE is to be externally controlled, multiplexer 40 of FIG. 3 selects one of external control signal input G0–G12, I1 or KEY. The CE signal controls the switching state of multiplexer 56. When no external clock enable control signal is desired, multiplexer 40 is set to select the "1" input and multiplexer 45 is set to select its noninverting input. In such case, multiplexer 56 continuously selects the output of multiplexer 52.

When an input digital data signal arrives at port I0, multiplexer 52 passes it to multiplexer 56. When the CE signal is asserted, multiplexer 56 passes the input digital data signal to latch 54 which thereafter latches its input onto an input of multiplexer 54 when the CLOCK signal is asserted. Multiplexer 40 of FIG. 3 is set to select the desired external control source for the CLOCK signal and multiplexer 46 of FIG. 3 is set depending on whether the input control signal driving the CLOCK signal is to be inverted. Multiplexer 54 passes the input digital data signal onward to terminal T0 via buffer 58 or 60 and multiplexer 62. Note that the output of latch 64 is tied back to an input of multiplexer 56. Thus in the latched mode, the port stores the state of the input digital data signal at the I0 terminal as it existed when the CE and CLOCK signals were last concurrently asserted.

In the flow-through mode, multiplexer 54 is set to select the output of multiplexer 52. Thus an input digital data signal arriving at terminal I0 is routed directly to terminal T0 via multiplexers 52, 54, and 62 and either buffer 58 or 60, bypassing multiplexer 56 and latch 64.

The configuration and operation of the output buffer 34 for latched or flow-through modes are similar to the configuration and operation of the input buffer 32. Note that the input and output buffers may be configured independently, if desired, with one path operating in latched mode and the other operating in flow-through mode.

Noninverting/Inverting Modes

In the noninverting mode, the port's input and output digital data signals are of the same polarity. In the inverting mode, the port output digital data signal polarity is reversed from that of the input digital data signal. In the input and output digital data signal paths, multiplexers 52 and 72, respectively, select inverting and non-inverting modes by selecting inverting or non-inverting inputs.

Tristate/Non-tristate Modes

When the input buffer 32 is configured to operate in the tristate mode, multiplexer 62 is set to select the output of tristate buffer 58 and multiplexer 40 of FIG. 3 is set to select a desired input control signal (G0–G12, I1, or KEY) to drive the tristate buffer control signal TRI. Multiplexer 43 of FIG. 3 determines whether the external control signal is inverted. When the output buffer 34 is configured to operate in the tristate mode, multiplexer 82 is set to select the output of tristate buffer 78 and multiplexer 40 of FIG. 3 is set to select a desired input control signal (G0–G12, I1, or KEY) to drive the tristate buffer control signal TRO. Multiplexer 44 determines whether the input control signal is inverted. When the input buffer 32 is to operate in the non-tristate mode, multiplexer 62 selects the output of buffer 60. Similarly, when the output path is to operate in the non-tristate mode, multiplexer 82 selects the output of buffer 80.

Port Control and Addressing

As illustrated in FIG. 3, port clock and clock enable signals, CLOCK and CE, and the input and output tristate control signals TRI and TRO can be derived from any of several external sources (G0–G12, I1, or KEY) depending on the selections made by multiplexer 40. The G0–G12 input control signals are provided in parallel to each port P0–P159 and are particularly useful, for example, in applications where the ports operate in the latched mode and the CLOCK signal in all the ports are to be synchronized.

When a mode control signal such as the TRO signal must be independently controlled for more than thirteen active ports, there aren't sufficient numbers of dedicated control inputs G0–G12 to control them. However, as illustrated in FIG. 1, each input port P(N), for (N)={0, . . . 159} has terminal I(N+1) as one additional control input. For port P0, as illustrated in FIG. 2, terminal I1 provides an additional control input to multiplexer 40. This additional control input can be used when the associated port P1 is inactive. For example, when all even numbered ports {P0, P2, . . . P158} are active and all the odd numbered ports {P1, P3, . . . P159} are inactive, each odd numbered terminal {I1, I3, . . . I159} can provide an independent control input for a corresponding even numbered port {P0, P2, ... P158}. Thus terminals of inactive ports can provide independent control inputs for up to 80 active ports.

A "TAG" addressing scheme allows the 5-line key bus KA0–KA4 to independently control up to 32 different ports. As mentioned above, the KEY signal is asserted by comparator 42 of FIG. 3 when the key bus KA0–KA4 matches the five TAG bits stored in shift register 21. Since the TAG bits can be set independently in each port P0–P159, the TAG bits constitute a port address which can have any of 32 values. The TAG addressing scheme reduces the number of control input terminals needed to provide a given level of independent control over the ports. However a host controller making use of the key bus must include appropriate encoding circuits to operate the key bus. Those skilled in the art will appreciate that the number of lines in the key bus may be increased to increase the number of ports that can be independently addressed by the KEY bus. For example a KEY bus having 8 lines would allow 256 addresses, more than sufficient to permit all 160 ports P0–P159 to be independently addressed.

Port Initialization

Referring to FIG. 1, an external host controller initializes the port P0–P159 by transmitting control data to interface circuit 16 via the JTAG bus 18. The interface circuit 16 forwards the control data to the ports. As shown in FIG. 3, the control data is stored in the shift register 21 of each port. As discussed herein above, the data in shift register 21 selects the various operating modes of the port by controlling multiplexers 40 and 43–46 as well as various multiplexers within buffers 32 and 34. For test purposes, the TDO outputs of shift registers 21 and 22 and 26 are connected together and brought back to the host controller as the TDO line of the JTAG bus. Whenever data is shifted into the registers 21 via the TDI line, previously stored data is shifted out of the registers onto the TDO line. The host controller can monitor data returned via the TDO line for test purposes to ensure that the crossbar switch is responding properly to instructions.

Bidirectional Repeater

Figure 5:
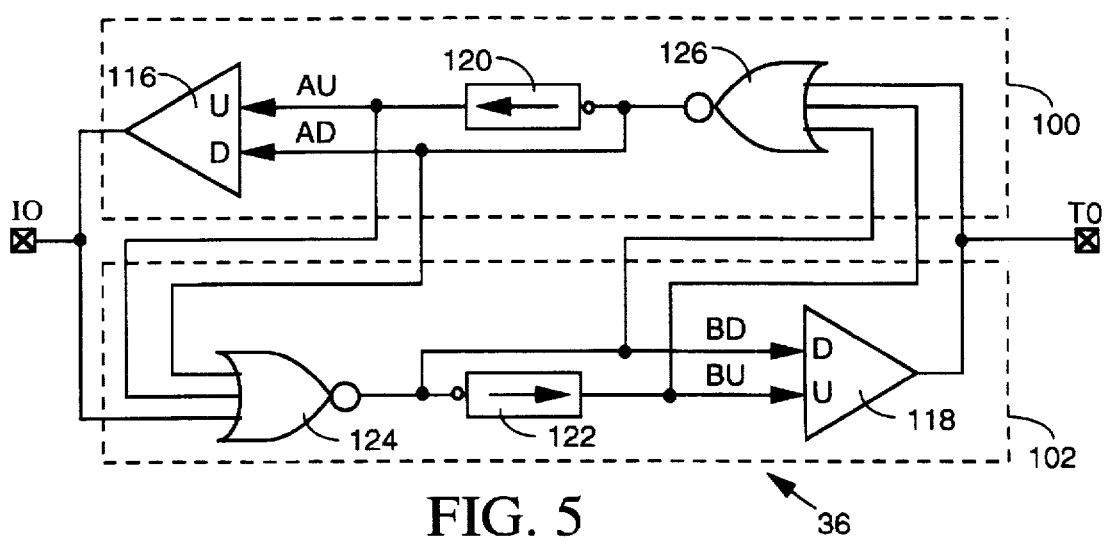
FIG. 5 illustrates the bidirectional bus repeater of FIG. 1 in more detailed block diagram form.

FIG. 5 illustrates the bidirectional bus repeater 36 of FIG. 3 in more detailed block diagram form. This bus repeater is described in U.S. Pat. No. 5,202,593 issued Apr. 13, 1993 to Huang et al and incorporated herein by reference. Bidirectional bus repeater 36 is formed by two unidirectional bus repeaters 100 and 102. When neither terminal I0 nor T0 is pulled to a low logic level by an external bus driver, small trickle currents from drivers 116 and 118 pull both terminals up to a high logic level. When an external bus driver pulls terminal I0 low, repeater 102 pulls terminal T0 low. When the external bus driver allows the I0 to rise again to the high logic level, repeater 102 temporarily supplies a high charging current to terminal T0 to quickly pull it up. The trickle current holds T0 up thereafter. Similarly, when an external bus driver pulls terminal T0 low, repeater 100 pulls terminal I0 low. When the external bus driver allows the T0 to rise, repeater 100 supplies a high charging current to terminal I0 to quickly pull it up. When either repeater 100 or 102 is actively driving its output, it transmits signals AU, AD, BD or BU to the other repeater preventing the other repeater from actively driving its output. Thus the first repeater 100 or 102 to detect a signal at its input buffers the signal onto its output and prevents the other repeater from operating until it has completed its buffering task.

Repeater 36 includes drivers 116 and 118, a pair of single-shot devices 120 and 122 and a pair of NOR gates 124 and 126. NOR gate 124 produces an indicating signal BD telling buffer 118 when to pull up terminal T0. Single-shot device 122, triggered by the falling edge of BD, generates indicating signal BU telling buffer 118 when to actively pull up T0. A signal at terminal I0 drives an input of NOR gate 124 while pull up and pull down signals AU and AD produced by single-shot device 120 and NOR gate 126 control other NOR gate 124 inputs. NOR gate 126 produces the indicating signal AD telling buffer 116 when to pull up terminal I0. Single-shot device 120, triggered by the falling edge of AD, generates indicating signal AU telling buffer 116 when to actively pull up I0. A signal at terminal T0 drives an input of NOR gate 126 while pull up and pull down signals BU and BD produced by single-shot device 122 and NOR gate 124 control other NOR gate 126 inputs.

Thus has been described an electronic crossbar switch for selectively routing digital and analog signals between its terminals. A separate port for each terminal provides a path for both analog and digital data signals flowing in and out of the switch. When providing a path for digital signals, each port can be configured to operate with or without tristate buffering under control of a tristate control signal, to optionally latch input or output signals in response to clock and clock enable signals, and to buffer signals passing in or out of the switch terminal in response to a direction control signal or without need for an externally generated direction control signal. A set of control inputs provided in common to all ports, allow an external host to transmit input control signals to each port. Each port may be programmed to select any of its input control signals as a tristate, clock enable, clock or direction control signal. A parallel "key" bus is also provided in common to all ports for conveying a key address from the host controller. Each port stores an adjustable port address and when the key address matches the port address, the port asserts an internal "KEY" signal. Each port may be configured to use the KEY signal selectively as either its tristate, clock enable, clock or direction control signal.

While the forgoing specification has described preferred embodiment(s) of the present invention, one skilled in the art may make many modifications to the preferred embodiment without departing form the invention in its broader aspects. For example the number of lines in the key bus may be increased or decreased or latches 34 and 54 could be replaced with other types of storage devices such as registers. The appended claims therefore are intended to cover all such modifications as fall within the true scope and spirit of the invention.

What is claimed is:

1. A programmable port responsive to first and second digital signals, a plurality of input signals, and input control data comprising:

a first terminal for receiving said first digital signal;

a second terminal for receiving said second digital signal;

first unidirectional buffer means connected between said first and second terminals for buffering said first digital signal received by said first terminal onto said second terminal when activated by a first control signal supplied as input thereto;

second unidirectional buffer means connected between said first and second terminals for buffering said second digital signal supplied as input to said second terminal onto said first terminal when activated by a second control signal supplied as input thereto;

switch means activated by a third control signal supplied as input thereto;

bidirectional repeater means for providing a buffered signal path between said first and second terminals via said switch means for buffering said first and second digital signals in opposite directions between said first and second terminals when said switch means is activated by said third control signal; and selection means for receiving said input control data and input control signals and selectively transmitting said first, second, and third control signals to said first and second unidirectional buffer means and said switch means, respectively, in response to combinations of said input control data and input control signals.

2. The programmable port in accordance with claim 1 wherein said bidirectional repeater comprises:

first unidirectional bus repeater means receiving a first indicating signal for buffering said first signal from said first terminal onto said second terminal and generating a second indicating signal upon concurrent receipt of said first digital signal and said first indicating signal; and second unidirectional bus repeater means receiving said second indicating signal from said first unidirectional bus repeater for buffering said second digital signal from said second terminal onto said first terminal and generating said first indicating signal upon concurrent receipt of said second digital signal and said first indicating.

3. The programmable port in accordance with claim 1 wherein said first unidirectional buffer means comprises a tristate buffer connected between said first and second terminals and having a tristate input receiving said first control signal.

4. The programmable port in accordance with claim 1 wherein said selection means comprises multiplexing means for receiving said plurality of input signals and for selecting three of said input signals for transmission as said first, second and third control signals to said first and second unidirectional buffer means and said switch means, said multiplexer means selecting the three input signals in response to said input control data.

5. A programmable port responsive to first and second digital signals, a plurality of input signals, and input control data comprising:

a first terminal for receiving said first digital signal;

a second terminal for receiving said second digital signal;

first unidirectional buffer means connected between said first and second terminals for buffering said first digital signal received by said first terminal onto said second terminal when activated by a first control signal supplied as input thereto;

second unidirectional buffer means connected between said first and second terminals for buffering said second digital signal supplied as input to said second terminal onto said first terminal when activated by a second control signal supplied as input thereto;

first switch means activated by a third control signal supplied as input thereto;

bidirectional repeater means for providing a buffered signal path between said first and second terminals via said switch means for buffering said first and second digital signals in opposite directions between said first and second terminals when said first switch means is activated by said third control signal;

second switch means connected between said first and second terminals for conveying signals between said first and second terminals when activated by receipt of a fourth control signal supplied as input thereto; and selection means for receiving said input control data and input control signals and selectively transmitting said first, second, third and fourth control signals to said first and second unidirectional buffer means, and said first and second switch means, respectively, in response to said input control data and input control signals.

6. The programmable port in accordance with claim 5 wherein said bidirectional repeater comprises:

first unidirectional bus repeater means receiving a first indicating signal for buffering said first signal from said first terminal onto said second terminal and generating a second indicating signal upon concurrent receipt of said first digital signal and said first indicating signal; and second unidirectional bus repeater means receiving said second indicating signal from said first unidirectional bus repeater for buffering said second digital signal from said second terminal onto said first terminal and generating said first indicating signal upon concurrent receipt of said second digital signal and said first indicating.

7. The programmable port in accordance with claim 5 wherein said first unidirectional buffer means comprises a tristate buffer connected between said first and second terminals and having a tristate input receiving said first control signal.

8. The programmable port in accordance with claim 5 wherein said selection means comprises:

multiplexing means for receiving said plurality of input signals and for selecting four of said input signals for transmission as said first, second, third and fourth control signals to said first and second unidirectional buffer means, and said first and second switch means, said multiplexer means selecting the four input signals in response to an input selection signal; and means for receiving and storing said input control data and for producing said selection signal in response to the stored control data.

9. An apparatus responsive to a plurality of input signals, and input control data for routing and buffering digital signals between a plurality of first terminals comprising:

a plurality of second terminals;

switch means for selectively routing said digital signals between said second terminals;

a plurality of ports, each port connected between a separate pair of said first and second terminals, each port comprising first unidirectional buffer means connected between said pair of first and second terminals for buffering a first digital signal received by said first terminal onto said second terminal when activated by a first control signal supplied as input thereto, second unidirectional buffer means connected between said pair of first and second terminals for buffering said second digital signal supplied as input to said second terminal onto said first terminal when activated by a second control signal supplied as input thereto, second switch means activated by a third control signal supplied as input thereto, bidirectional repeater means for providing a buffered signal path between said pair of first and second terminals via said second switch means for buffering said first and second digital signals in opposite directions between said pair of first and second terminals when said second switch means is activated by said third control signal, and selection means for receiving said input control data and control signals and selectively transmitting said first, second, and third control signals to said first unidirectional buffer means, said second unidirectional means and said switched bidirectional repeater means, respectively, in response to said input control data and input control signals.

10. The apparatus in accordance with claim 9 wherein said bidirectional repeater comprises:

first unidirectional bus repeater means receiving a first indicating signal for buffering said first signal from said first terminal onto said second terminal and generating a second indicating signal upon concurrent receipt of said first digital signal and said first indicating signal; and second unidirectional bus repeater means receiving said second indicating signal from said first unidirectional bus repeater for buffering said second digital signal from said second terminal onto said first terminal and generating said first indicating signal upon concurrent receipt of said second digital signal and said first indicating.

11. The apparatus in accordance with claim 9 wherein said first unidirectional buffer means comprises a tristate buffer connected between said first and second terminals and having a tristate input receiving said first control signal.

12. The programmable port in accordance with claim 9 wherein said selection means comprises:

multiplexer means for receiving said plurality of input signals and for selecting three of said input signals for transmission as said first, second and third control signals to said first and second unidirectional buffer means and said switch means, said multiplexer means selecting the three input signals in response to an input selection signal; and means for receiving and storing said input control data and for producing said selection signal in response to the stored control data.

\* \* \* \* \*